(12) United States Patent
Zhang et al.

(10) Patent No.: US 11,049,862 B2
(45) Date of Patent: Jun. 29, 2021

(54) SEMICONDUCTOR DEVICE AND FABRICATION METHOD THEREOF

(71) Applicant: HeFeChip Corporation Limited, Sai Ying Pun (HK)

(72) Inventors: John Zhang, Altamont, NY (US); Yanzun Li, Lagrangeville, NY (US); GuoLiang Zhu, Rexford, NY (US); Tongqing Chen, Voorheesville, NY (US); Huang Liu, Mechanicville, NY (US)

(73) Assignee: HeFeChip Corporation Limited, Sai Ying Pun (HK)

(*) Notice: Subject to any disclaimer, the term of this patent is extended or adjusted under 35 U.S.C. 154(b) by 0 days.

(21) Appl. No.: 16/658,135

(22) Filed: Oct. 20, 2019

(65) Prior Publication Data

US 2021/0118888 A1 Apr. 22, 2021

(51) Int. Cl.
*H01L 27/108* (2006.01)

(52) U.S. Cl.
CPC .. *H01L 27/10832* (2013.01); *H01L 27/10826* (2013.01); *H01L 27/10867* (2013.01); *H01L 27/10879* (2013.01)

(58) Field of Classification Search
CPC ......... H01L 27/10732; H01L 27/10867; H01L 27/10879; H01L 27/10826; H01L 27/108; H01L 27/10805; H01L 2924/1436
See application file for complete search history.

(56) References Cited

U.S. PATENT DOCUMENTS

| | | | |
|---|---|---|---|
| 6,635,525 B1 | 10/2003 | Mandelman | |
| 7,276,751 B2 | 10/2007 | Ho | |
| 8,629,017 B2 | 1/2014 | Pei | |
| 9,059,319 B2 | 6/2015 | Anderson | |
| 9,437,675 B1 | 9/2016 | Cheng | |
| 9,659,939 B1* | 5/2017 | Cao | H01L 27/10829 |
| 2003/0025140 A1* | 2/2003 | Kusters | H01L 27/10832 257/301 |
| 2004/0192007 A1* | 9/2004 | Staub | H01L 21/76807 438/387 |
| 2007/0057302 A1* | 3/2007 | Ho | H01L 28/91 257/301 |
| 2007/0063244 A1* | 3/2007 | Ho | H01L 28/91 257/301 |
| 2007/0117307 A1* | 5/2007 | Cheng | H01L 29/945 438/238 |

* cited by examiner

*Primary Examiner* — Galina G Yushina
(74) *Attorney, Agent, or Firm* — Winston Hsu

(57) ABSTRACT

A semiconductor device including a silicon-on-insulator (SOI) wafer comprising a doped silicon substrate, a buried oxide layer on the doped silicon substrate, and a silicon device layer on the buried oxide layer. An inner electrode and a node dielectric layer of a capacitor are disposed in a trench of the SOI wafer. The inner electrode and the node dielectric layer penetrate through the buried oxide layer and extend into the doped silicon substrate. At least a select transistor is disposed on the buried oxide layer. The select transistor includes a source doping region and a drain doping region, a channel region between the source doping region and the drain doping region, and a gate over the channel region. At least an embedded contact is disposed atop the capacitor to electrically couple the drain doping region of the select transistor with the inner electrode of the capacitor.

8 Claims, 5 Drawing Sheets

SEMICONDUCTOR DEVICE AND FABRICATION METHOD THEREOF

BACKGROUND OF THE INVENTION

1. Field of the Invention

The present disclosure relates generally to the field of semiconductor technology. More particularly, the present disclosure relates to a semiconductor memory device and a method for fabricating the same.

2. Description of the Prior Art

Dynamic random access memories (DRAMs), which are employed in devices such as power processors and application specific integrated circuits (ASICs), are known in the art.

A DRAM device typically comprises a trench capacitor, which is a three dimensional device formed by etching a trench into a semiconductor substrate. A capacitor dielectric layer is formed on the inner walls of the trench. The trench is then filled with an electrically conductive material such as heavily-doped polysilicon, which can function as one electrode of the trench capacitor while an N-type doped region surrounding the lower portion of the trench functions as the second electrode thereof. A transistor can be formed above and in electrical communication with the trench capacitor.

However, there is a drawback when the transistor is electrically coupled to the trench capacitor via the doped polysilicon as an embedded contact. The embedded polysilicon contacts increase charge and discharge time of the DRAM capacitors. To meet the retention time requirement, a large capacitor that occupies a large valuable chip area is needed to compensate the increased charge and discharge time caused by the employment of the embedded polysilicon contacts.

SUMMARY OF THE INVENTION

It is one object to provide an improved semiconductor device that is capable of reducing charge and discharge time of the capacitors.

One aspect of the present disclosure provides a semiconductor device including a substrate comprising a doped silicon substrate, a buried oxide layer on the doped silicon substrate, and a silicon device layer on the buried oxide layer. An inner electrode and a node dielectric layer of a capacitor are disposed in a trench of the substrate. The inner electrode and the node dielectric layer penetrate through the buried oxide layer and extend into the doped silicon substrate. At least a select transistor is disposed on the buried oxide layer. The select transistor includes a source doping region and a drain doping region, a channel region between the source doping region and the drain doping region, and a gate over the channel region. At least an embedded contact is disposed atop the capacitor to electrically couple the drain doping region of the select transistor with the inner electrode of the trench capacitor. The embedded contact comprises a metallic layer wrapped around by a silicide layer. A portion of the silicide layer is interposed between the metallic layer and the inner electrode.

According to some embodiments, the node dielectric layer lines a sidewall of the trench.

According to some embodiments, the trench capacitor comprises a node dielectric layer lining a sidewall of the trench.

According to some embodiments, the inner electrode is surrounded by the node dielectric layer.

According to some embodiments, the inner electrode comprises a doped polysilicon layer and a TiN layer between the node dielectric layer and the doped polysilicon layer.

According to some embodiments, the embedded contact is buried in the silicon device layer and the buried oxide layer.

According to some embodiments, the metallic layer comprises W, Ti, TiN, Ta, TaN, Cu, Au, Ni, or any combinations thereof. According to some embodiments, the silicide layer comprises tungsten silicide, cobalt silicide, nickel silicide, or titanium silicide.

According to some embodiments, the transistor is on or in the silicon device layer.

According to another aspect of the present disclosure, a method for forming a semiconductor device is disclosed. A substrate comprising a doped silicon substrate, a buried oxide layer on the doped silicon substrate, and a silicon device layer on the buried oxide layer is provided. At least a capacitor is formed within a trench of the substrate. An inner electrode and the node dielectric layer of the capacitor penetrate through the buried oxide layer and extend into the doped silicon substrate. At least a select transistor is formed on the buried oxide layer. The select transistor comprises a source doping region and a drain doping region, a channel region between the source doping region and the drain doping region, and a gate over the channel region. At least an embedded-contact is formed atop the capacitor to electrically couple the drain doping region of the select transistor with the inner electrode of the capacitor.

According to some embodiments, the node dielectric layer lines a sidewall of the trench.

According to some embodiments, the step of forming a capacitor in a trench of the substrate comprises: forming the inner electrode in the trench and recessing the inner electrode, wherein the inner electrode is surrounded by the node dielectric layer.

According to some embodiments, the inner electrode comprises a doped polysilicon layer and a TiN layer between the node dielectric layer and the doped polysilicon layer.

According to some embodiments, the doped polysilicon layer has a top surface that is approximately coplanar with an upper surface of the doped silicon substrate.

According to some embodiments, the embedded contact is buried in the silicon device layer and the buried oxide layer.

According to some embodiments, the embedded contact comprises a metallic layer wrapped around by a silicide layer. A portion of the silicide layer is interposed between the metallic layer and the inner electrode. According to some embodiments, the metallic layer comprises W, Ti, TiN, Ta, TaN, Cu, Au, Ni, or any combinations thereof. According to some embodiments, the silicide layer comprises tungsten silicide, cobalt silicide, nickel silicide, or titanium silicide.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
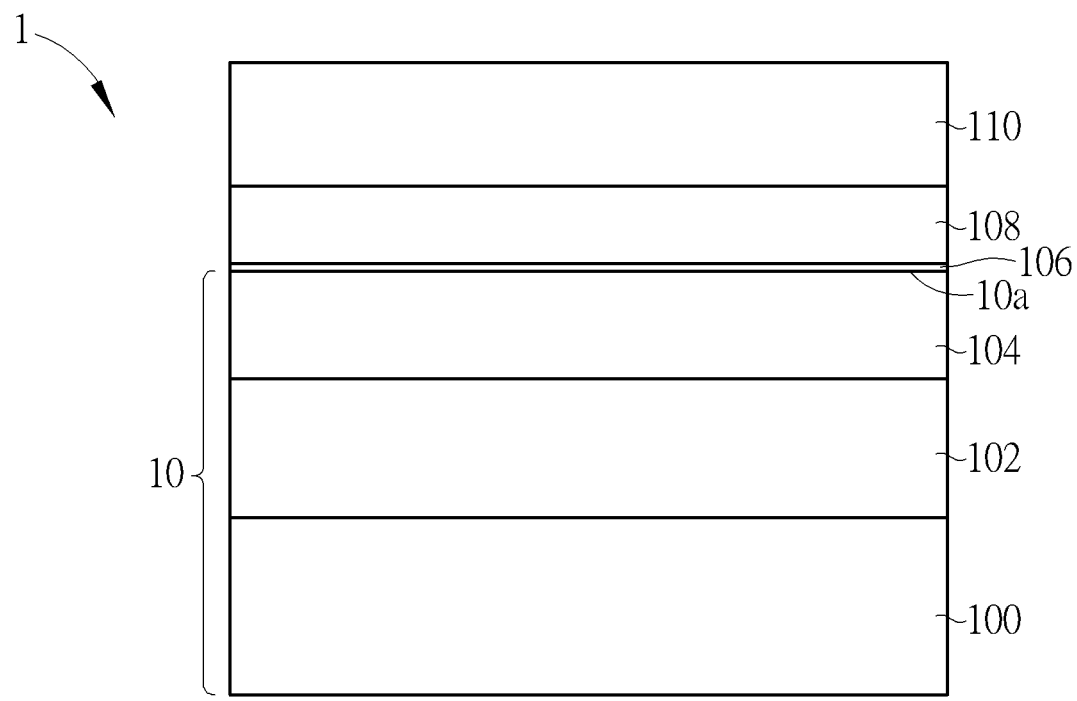
FIG. 1 to FIG. 10 are cross-sectional diagrams showing a method for fabricating a semiconductor device according to one embodiment of the present disclosure.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a semiconductor device such as a semiconductor memory device having a capacitor, which is particularly suited for DRAM or embedded DRAM (eDRAM) applications. The semiconductor device includes a substrate comprising a doped silicon substrate, a buried oxide layer on the doped silicon substrate, and a silicon device layer on the buried oxide layer. An inner electrode and a node dielectric layer of a capacitor are disposed in a trench of the substrate. The inner electrode and the node dielectric layer penetrate through the buried oxide layer and extend into the doped silicon substrate. At least a select transistor is disposed on the buried oxide layer. The select transistor includes a source doping region and a drain doping region, a channel region between the source doping region and the drain doping region, and a gate over the channel region. At least an embedded contact is disposed atop the capacitor to electrically couple the drain doping region of the select transistor with the inner electrode of the trench capacitor. The embedded contact comprises a metallic layer wrapped around by a silicide layer. A portion of the silicide layer is interposed between the metallic layer and the inner electrode.

FIG. 1 to FIG. 10 are schematic, cross-sectional diagrams showing a method for fabricating a semiconductor device 1 according to one embodiment of the present disclosure. For the sake simplicity only a germane portion of the semiconductor device is illustrated through FIG. 1 to FIG. 10. It is to be understood that the semiconductor device may comprise a memory array and a peripheral circuit (or a support circuit).

As shown in FIG. 1, a substrate 10 is provided. According to one embodiment, for example, the substrate 10 may comprise a silicon-on-insulator (SOI) structure comprising a doped silicon substrate 100, a buried oxide layer 102, and a silicon device layer 104. According to one embodiment, for example, the SOI structure may be a SIMOX wafer or a bonded wafer, which are both commercially available. According to one embodiment, for example, the doped silicon substrate 100 may be an N-type heavily doped silicon substrate 100, and the silicon device layer 104 may be a P-type silicon layer. According to one embodiment, for example, the silicon device layer 104 may have a thickness of about 50-500 nm, the buried oxide layer 102 may have a thickness of about 100-500 nm, and the doped silicon substrate 100 may be 50-500 micrometers, but not limited thereto.

According to one embodiment, a pad oxide layer 106 may be deposited on a top surface 10a of the substrate 10. For example, the pad oxide layer 106 may be deposited by chemical vapor deposition (CVD) methods known in the art. After depositing the pad oxide layer 106, a nitride layer 108 is deposited on the pad oxide layer 106. For example, the nitride layer 108 may be a silicon nitride layer and may have a thickness of about 100-300 nm. The nitride layer 108 may be deposited by CVD methods. According to one embodiment, after depositing the nitride layer 108, an oxide hard mask 110 having a thickness of about 0.6-1.0 micrometers is deposited on the nitride layer 108.

Figure 2:
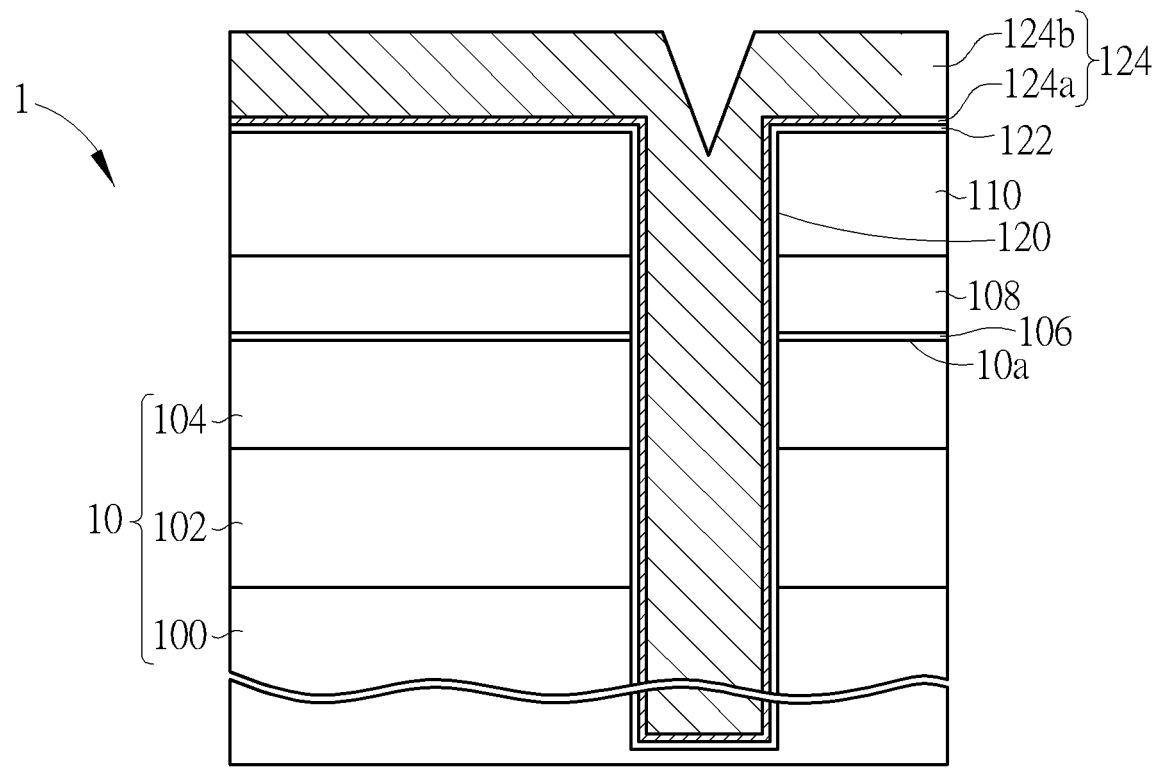

As shown in FIG. 2, an anisotropic dry etching process such as a reactive ion etching (ME) process may be performed to form a trench 120 extending through the oxide hard mask 110, the nitride layer 108, the pad oxide layer 106, the silicon device layer 104, the buried oxide layer 102, and into the doped silicon substrate 100. A node dielectric layer 122 is conformally deposited on the interior surface of the trench 120 and on the top surface of the oxide hard mask 110. The node dielectric layer 122 may comprise, for example, silicon oxide, silicon nitride, aluminum oxide, hafnium oxide, zirconium oxide, barium strontium oxide, or any combinations thereof. Preferably, the node dielectric layer 122 may comprise a high-k (i.e., k>4.0) dielectric material, such as $HfO_2$ or $HfSiO_x$. The node dielectric layer 122 may be deposited by any suitable deposition methods such as atomic layer deposition (ALD), CVD or physical vapor deposition (PVD) methods. According to one embodiment, the node dielectric layer 122 may have a thickness of about 10-100 angstroms, but not limited thereto.

According to one embodiment, after the deposition of the node dielectric layer 122, a capacitor electrode layer (inner electrode) 124 is deposited into the trench 120. According to one embodiment, for example, the capacitor electrode layer 124 may comprise a titanium nitride (TiN) layer 124a lining the sidewall of the trench 120 on the node dielectric layer 122, and a doped polysilicon (poly-1) layer 124b that completely fills up the remaining space within the trench 120. According to one embodiment, the TiN layer 124a may reduce the series resistance of the trench capacitor. In some embodiments, the TiN layer 124a may be omitted. According to one embodiment, the doped polysilicon layer 124b may be an N-type doped polysilicon.

Figure 3:
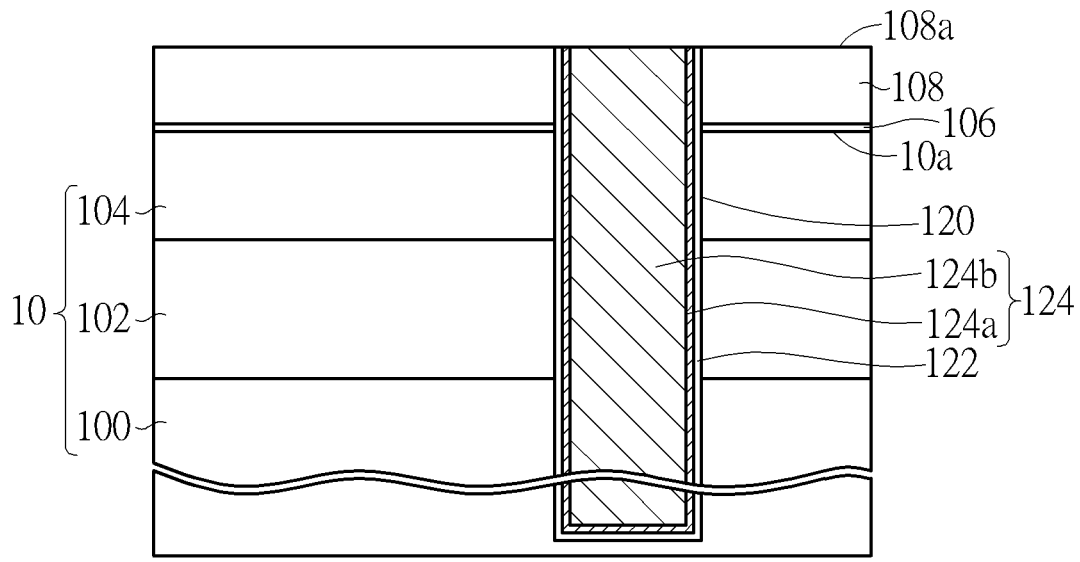

As shown in FIG. 3, after the deposition of the capacitor electrode layer 124, a planarization process may be performed to render the upper surface of the capacitor electrode layer 124 including the TiN layer 124a and the doped polysilicon layer 124b within the trench 120 and the upper surface of the node dielectric layer 122 coplanar with the top surface 108a of the nitride layer 108. According to one embodiment, for example, the planarization process may be a chemical mechanical polishing (CMP) process that is a material removal process using both chemical reactions and mechanical forces to remove material and planarize a surface. At this point, the capacitor electrode layer 124 and the node dielectric layer 122 outside the trench 120 are removed. The oxide hard mask 110 is also removed by CMP process. The nitride layer 108 may act as a polishing stop layer.

Figure 4:
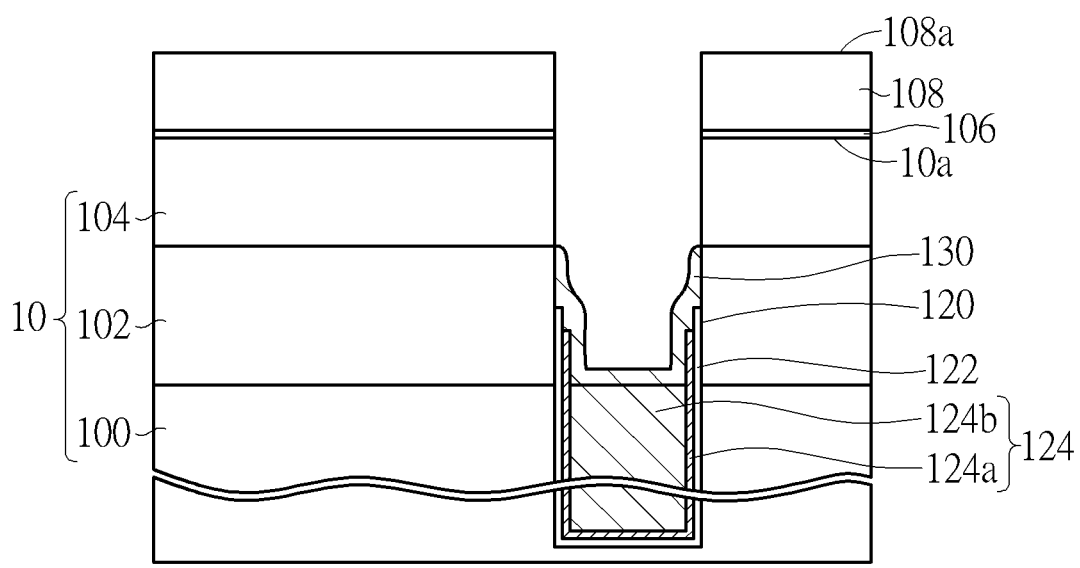

As shown in FIG. 4, an upper portion of the capacitor electrode layer 124 within the trench 120 is selectively removed to expose an upper portion of the node capacitor layer 122. For example, the top surface of the doped polysilicon layer 124b may be first recessed to a horizontal plane that is somewhere between an upper surface and lower surface of the buried oxide layer 102. Subsequently, the exposed TiN layer 124a that is not covered by the remaining doped polysilicon layer 124b within the trench 120 is selectively removed. The exposed upper portion of the node capacitor layer 122 is then selectively removed. The selective etching of the doped polysilicon layer 124, the TiN layer 124a, and the node capacitor layer 122 is known in the art, and therefore the details of the etchant chemistry is omitted.

After the recess etching of the node capacitor layer 122, a thin polysilicon (poly-2) layer is conformally deposited on the nitride layer 108 and on the interior surface within the trench 120. The conformal, thin polysilicon layer (not explicitly shown) covers the top surface 108a of the nitride layer 108, the sidewalls of the silicon device layer 104, the partial sidewalls of the buried oxide layer 102, the exposed surface of the TiN layer 124a, the exposed surface of the node capacitor layer 122, and the top surface of the doped polysilicon layer 124b. An anisotropic etching process is then performed to etch the conformal, thin polysilicon layer until the top surface 108a of the nitride layer 108 is revealed, thereby forming a polysilicon spacer 130 covering sidewalls of the buried oxide layer 102. The polysilicon spacer 130 also covers the node capacitor layer 122, the TiN layer 124a, and partially covers the doped polysilicon layer 124b. According to one embodiment, the polysilicon spacer 130 may partially cover the sidewalls of the silicon device layer 104.

According to another embodiment, the polysilicon spacer 130 may be formed by the following steps. A sacrificial material, such as photoresist, is deposited to fill the trench 120 and then $O_2$ plasma is used to recess the sacrificial material down to the interface between the silicon device layer 104 and the buried oxide layer 102, or slightly higher. Isotropic poly etch can then be employed to remove the exposed portion of the thin polysilicon (poly-2) layer not covered by the sacrificial material.

Figure 5:
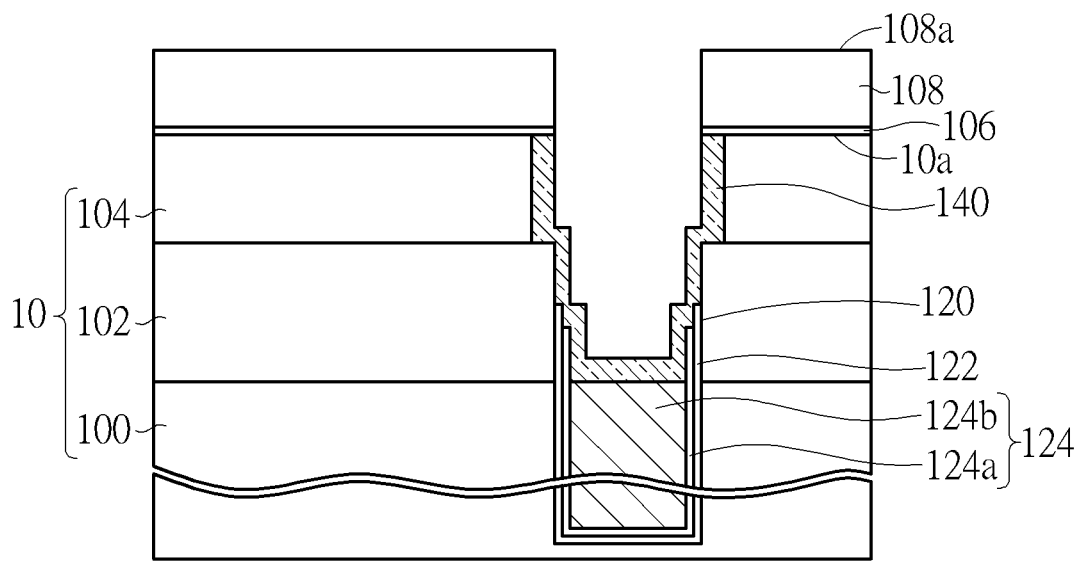

As shown in FIG. 5, a self-aligned silicide (salicide) process is performed to transform the exposed sidewall of the silicon device layer 104, the polysilicon spacer 130, and a portion of the doped polysilicon layer 124b into a silicide layer 140. According to one embodiment, for example, the silicide layer 140 may comprise tungsten silicide ($WSi_x$), cobalt silicide ($CoSi_x$), nickel silicide ($NiSi_x$), or titanium silicide ($TiSi_x$), but not limited thereto. According to one embodiment, for example, to form the silicide layer 140, a thin metal layer (not shown) such as W, Co, Ni, or Ti is deposited on the substrate 10. The thin metal layer conformally covers the interior surface of the trench 120. The thin metal layer is in direct contact with the exposed sidewall of the silicon device layer 104, the polysilicon spacer 130, and the doped polysilicon layer 124b. Subsequently, an thermal or anneal process such as a rapid thermal annealing (RTA) is performed such that the metal reacts with the exposed sidewall of the silicon device layer 104, the polysilicon spacer 130, and the doped polysilicon layer 124b, thereby forming the silicide layer 140. The unreacted metal layer may be removed using methods known in the art. As depicted in FIG. 5, the silicon device layer 104 is electrically coupled to the doped polysilicon layer 124b through the silicide layer 140.

Figure 6:
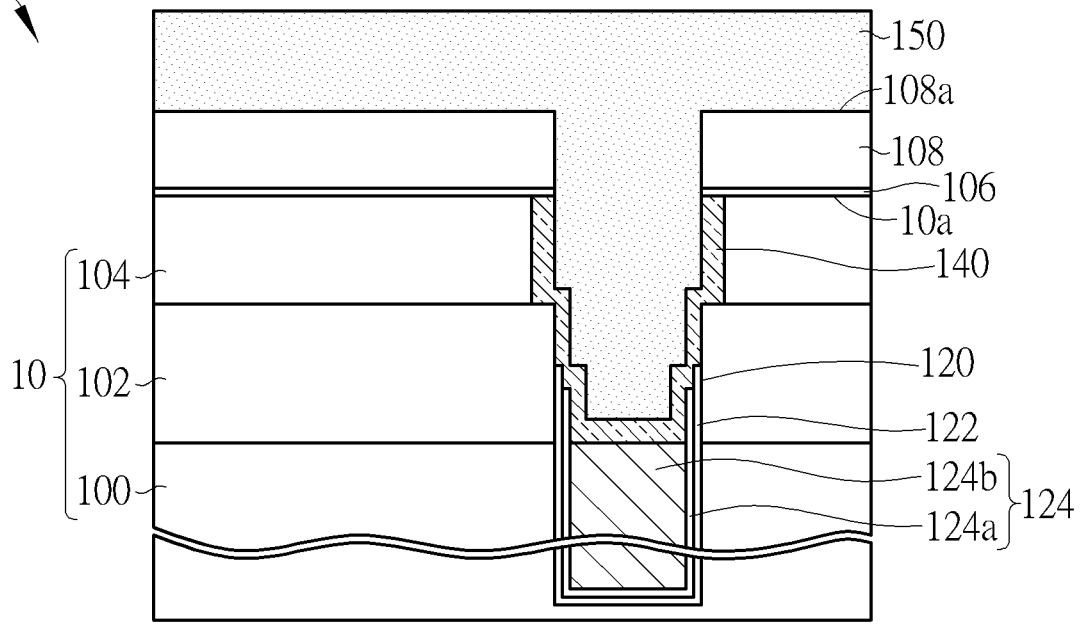

As shown in FIG. 6, a conductive layer 150 such as a metal layer is deposited on the substrate 10. The remaining space within the trench 120 is completely filled with the conductive layer 150. At this point, the top surface 108a is also covered by the conductive layer 150. According to one embodiment, for example, the conductive layer (or metallic layer) 150 may comprise W, Ti, TiN, Ta, TaN, Cu, Au, Ni, or any combinations thereof. According to one embodiment, for example, the silicide layer 140 comprises WSi, and the conductive layer 150 comprises W. According to one embodiment, the deposited conductive layer 150 may be formed by CVD or ALD methods and may have low-resistivity.

Figure 7:
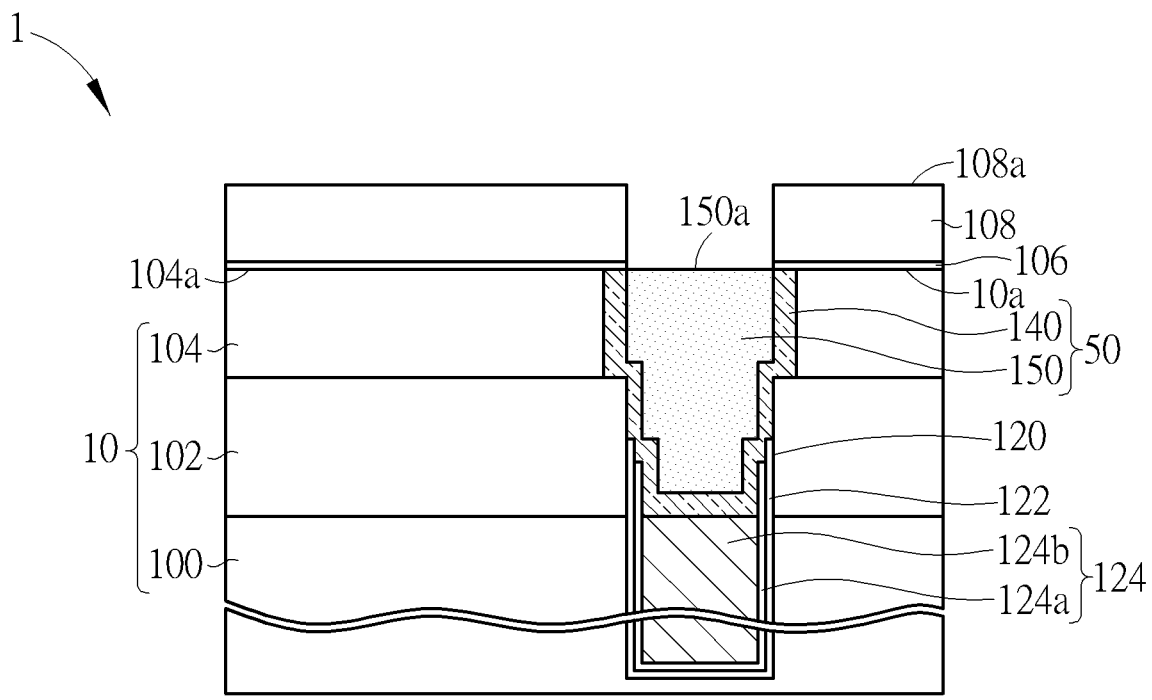

As shown in FIG. 7, an etching back process is performed to etch the conductive layer 150. After the etching back process is complete, the top surface 150a of the remaining conductive layer 150 is approximately coplanar with the top surface 104a of the silicon device layer 104. According to one embodiment, the remaining conductive layer 150 and the silicide layer 140 together form an embedded contact 50 within the trench 120. According to one embodiment, for example, a gas chemistry of $SF_6$, $O_2$ and He may be used to etch the conductive layer 150 comprising W.

Figure 8:
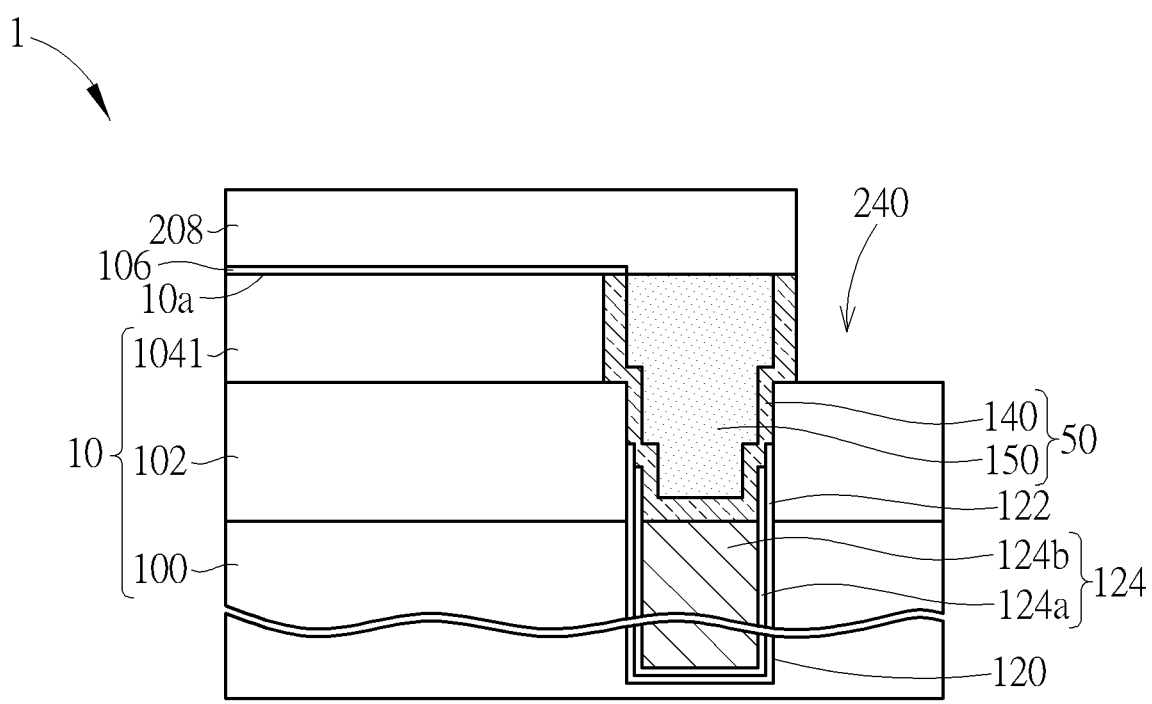

As shown in FIG. 8, after recessing the conductive layer 150, the nitride layer 108 is selectively removed from the top surface of the pad oxide layer 106. Subsequently, a patterned hard mask 208 such as a patterned nitride hard mask is formed on the substrate 10. According to one embodiment, for example, the patterned hard mask 208 is formed by performing a lithographic process and a dry etching process. It is noteworthy that the patterned hard mask 208 overlaps with the conductive layer 150. An etching process such as RIE process is then performed to etch the silicon device layer 104, the conductive layer 150 and the silicide layer 140, thereby forming an active area 1041 and an isolation trench 240. The isolation trench 240 also surrounds the active area 1041, which is not shown in the cross section of FIG. 8.

Figure 9:
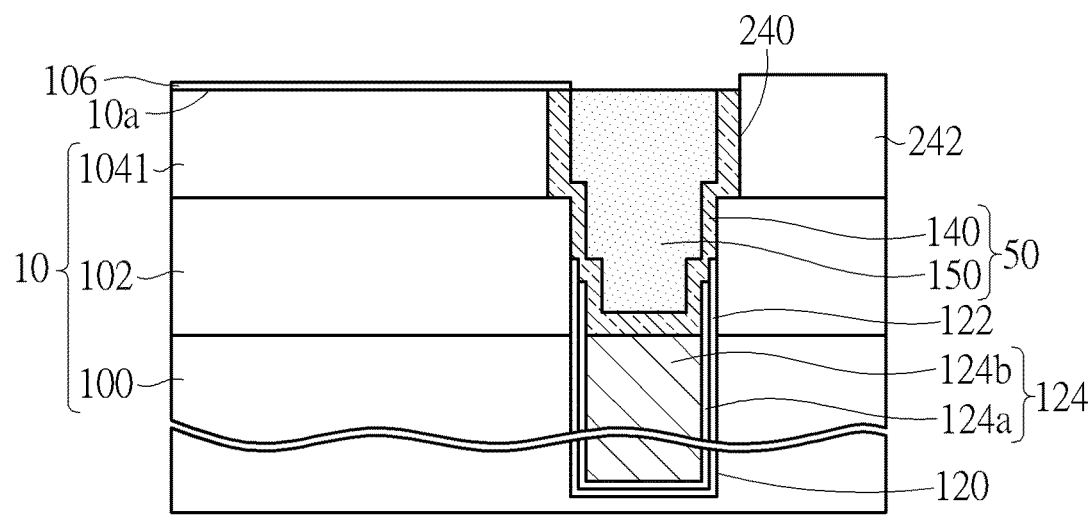

As shown in FIG. 9, a trench oxide layer 242 is deposited into the isolation trench 240. The trench oxide layer 242 also covers the patterned hard mask 208. According to one embodiment, for example, the trench oxide layer 242 may comprise silicon oxide, but not limited thereto. The trench oxide layer 242 may be deposited by using any suitable CVD or ALD methods. After the deposition of the trench oxide layer 242, a CM' process is performed to planarize the trench oxide layer 242 until the top surface of the patterned hard mask 208 is revealed. The patterned hard mask 208 is then selectively removed using methods known in the art, for example, hot phosphoric acid solution.

Figure 10:
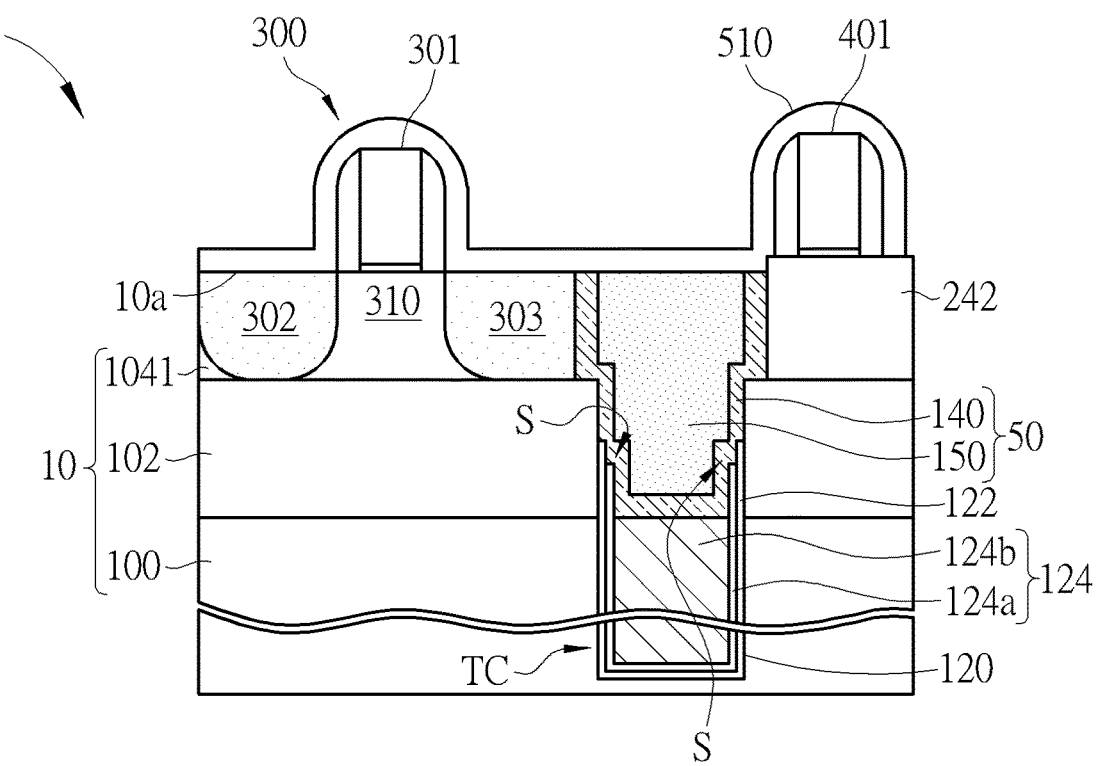

As shown in FIG. 10, a select transistor 300 is then formed on the active area 1041. According to one embodiment, the select transistor 300 is in close proximity to the embedded contact 50. According to one embodiment, the select transistor 300 may comprise a source doping region 302 and a drain doping region 303 such as N+ doping regions in the active area 1041. The source doping region 302 is spaced apart from the drain doping region 303. A channel region 310 may be defined between the source doping region 302 and the drain doping region 303. A gate 301 is disposed directly above the channel region 310. According to one embodiment, a passing gate 401 may be disposed on the trench oxide layer 242. According to one embodiment, a contact etch stop layer (CESL) 510 may be deposited on the substrate 10 in a blanket manner.

Structurally speaking, as shown in FIG. 10, the semiconductor device 1 comprises a capacitor TC that is formed in the substrate 10. An inner electrode and a node dielectric layer of the capacitor TC may penetrate through the buried oxide layer 102 and may extend to a predetermined depth (e.g., several micrometers) into the doped silicon substrate 100. The capacitor TC comprises the node dielectric layer 122 lining the sidewall of the trench 120. The node dielectric layer 122 may extend up to the sidewall of the buried oxide layer 102. The upper sidewall of the buried oxide layer 102 may not be covered by the node dielectric layer 122. The capacitor electrode layer (inner electrode) 124 is surrounded by the node dielectric layer 122. The node dielectric layer 122 electrically isolate the capacitor electrode layer (inner electrode) 124 from the doped silicon substrate 100 that acts as the other capacitor electrode or outer electrode of the capacitor TC.

According to one embodiment, the top surface of the doped polysilicon layer 124b may be approximately coplanar with the upper surface of the doped silicon substrate 100. According to one embodiment, the TiN layer 124a may slightly protrude from the top surface of the doped polysilicon layer 124b. The upper end of the node dielectric layer 122, the upper end of the TiN layer 124a, and the top surface of the doped polysilicon layer 124b form a step structure S around the upper portion of the trench 120.

On top of the capacitor electrode layer 124, the embedded contact 50 comprising metal and metal silicide such as W and $WSi_x$ is provided. Through the embedded contact 50, the capacitor electrode layer 124 is electrically coupled to the drain doping region 303 of the select transistor 300. The silicide layer 140 on the sidewall of the active area 1041 form low resistance ohmic contact between the drain doping region 303 and the conductive layer 150. The passing gate 401 may be disposed on the trench oxide layer 242. The gate 301 and the passing gate 401 may be covered with the CESL 510. It is to be understood that the select transistor 300 may be a planar-type transistor or a fin-type transistor. It is advantageous to use the present disclosure because the embedded metal contact significantly reduce the charge and discharge time of the eDRAM capacitor. On the same retention time standard as the prior art, the size and dimension of the capacitor can be shrunk so as to achieve an eDRAM device with higher density.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate comprising a doped silicon substrate, a buried oxide layer on the doped silicon substrate, and a silicon device layer on the buried oxide layer;
   a capacitor, at least an inner electrode and a node dielectric layer of the capacitor in a trench of the substrate, wherein the inner electrode and the node dielectric layer penetrate through the buried oxide layer and extend into the doped silicon substrate;
   at least a select transistor on the buried oxide layer, wherein the select transistor comprises a source doping region and a drain doping region, a channel region between the source doping region and the drain doping region, and a gate over the channel region; and
   at least an embedded contact atop the capacitor to electrically couple the drain doping region of the select transistor with the inner electrode of the capacitor, wherein the embedded contact comprises a metallic layer wrapped around by a silicide layer, and wherein a portion of the silicide layer is interposed between the metallic layer and the inner electrode.

2. The semiconductor device according to claim 1, wherein the node dielectric layer lines a sidewall of the trench.

3. The semiconductor device according to claim 2, wherein the inner electrode is surrounded by the node dielectric layer.

4. The semiconductor device according to claim 3, wherein the inner electrode comprises a doped polysilicon layer and a TiN layer between the node dielectric layer and the doped polysilicon layer.

5. The semiconductor device according to claim 4, wherein the doped polysilicon layer has a top surface that is approximately coplanar with an upper surface of the doped silicon substrate.

6. The semiconductor device according to claim 1, wherein the embedded contact is buried in the silicon device layer and the buried oxide layer.

7. The semiconductor device according to claim 1, wherein the metallic layer comprises W, Ti, TiN, Ta, TaN, Cu, Au, Ni, or any combinations thereof.

8. The semiconductor device according to claim 1, wherein the silicide layer comprises tungsten silicide, cobalt silicide, nickel silicide, or titanium silicide.

* * * * *